US011923291B2

(12) United States Patent
Kato

(10) Patent No.: US 11,923,291 B2
(45) Date of Patent: Mar. 5, 2024

(54) VIA CONNECTION TO WIRING IN A SEMICONDUCTOR DEVICE

(71) Applicant: Kioxia Corporation, Tokyo (JP)

(72) Inventor: Atsushi Kato, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 167 days.

(21) Appl. No.: 17/007,626

(22) Filed: Aug. 31, 2020

(65) Prior Publication Data

US 2021/0265265 A1 Aug. 26, 2021

(30) Foreign Application Priority Data

Feb. 25, 2020 (JP) ................. 2020-029592

(51) Int. Cl.
H01L 23/522 (2006.01)
H01L 21/768 (2006.01)
H01L 23/00 (2006.01)

(52) U.S. Cl.
CPC .... *H01L 23/5226* (2013.01); *H01L 21/76849* (2013.01); *H01L 21/7685* (2013.01); *H01L 21/76856* (2013.01); *H01L 21/76864* (2013.01); *H01L 24/08* (2013.01); *H01L 21/7684* (2013.01); *H01L 2224/08112* (2013.01); *H01L 2224/08145* (2013.01)

(58) Field of Classification Search
CPC ............. H01L 23/5226; H01L 21/7685; H01L 21/76856
See application file for complete search history.

(56) References Cited

U.S. PATENT DOCUMENTS

| 5,563,448 | A | 10/1996 | Lee et al. |
| 6,207,486 | B1 | 3/2001 | Nishiyama |
| 7,745,282 | B2* | 6/2010 | Yang ................. H01L 21/76856 438/653 |
| 8,198,730 | B2 | 6/2012 | Tagami et al. |
| 8,785,283 | B2* | 7/2014 | Chen ..................... H01L 23/485 438/620 |
| 9,343,402 | B2 | 5/2016 | Sakata et al. |
| 10,199,325 | B2* | 2/2019 | Yim ................... H01L 23/5228 |

(Continued)

FOREIGN PATENT DOCUMENTS

| CN | 101527279 A | 9/2009 |
| JP | H11-026577 A | 1/1999 |

(Continued)

*Primary Examiner* — Daniel Luke
(74) *Attorney, Agent, or Firm* — Foley & Lardner LLP

(57) ABSTRACT

A semiconductor device includes a first substrate, a logical circuit, a first insulating film, a wiring, a plug, and a first layer containing a metal oxide or a metal nitride. The logical circuit is disposed on the first substrate. The first insulating film is disposed above the logical circuit. The wiring includes a first film disposed in the first insulating film, the first film extending in a first direction along an upper surface of the first substrate, and the first film containing a metal, and a first metal layer disposed in the first insulating film via the first film. The plug is disposed under the wiring, extends in a second direction that intersects the first direction, and is electrically connected to the wiring. The first layer is provided between an upper end of the plug and a bottom end of the wiring.

26 Claims, 13 Drawing Sheets

(56) References Cited

U.S. PATENT DOCUMENTS

| | | | |
|---|---|---|---|
| 10,431,494 B2 * | 10/2019 | Yang | ................. H01L 21/76849 |
| 10,984,862 B2 * | 4/2021 | Liu | ...................... G11C 11/005 |
| 2004/0209461 A1 | 10/2004 | Han | |
| 2005/0098892 A1 | 5/2005 | Hu et al. | |
| 2007/0222068 A1 | 9/2007 | Yamada | |
| 2008/0197500 A1 | 8/2008 | Yang et al. | |
| 2008/0311718 A1 | 12/2008 | Futase | |
| 2009/0227101 A1 | 9/2009 | Jung et al. | |
| 2010/0123249 A1 | 5/2010 | Motoyama | |
| 2013/0140709 A1 | 6/2013 | Matsuura | |
| 2015/0171011 A1 | 6/2015 | Kato | |
| 2015/0240344 A1 | 8/2015 | Ishizaka et al. | |
| 2018/0151490 A1 | 5/2018 | Yim et al. | |
| 2019/0198468 A1 | 6/2019 | Usami | |
| 2020/0411433 A1 * | 12/2020 | Lilak | ............... H01L 21/823475 |

FOREIGN PATENT DOCUMENTS

| | | |
|---|---|---|
| JP | 2008-311457 A | 12/2008 |
| JP | 2012-216765 A | 11/2012 |
| KR | 940022708 A | 10/1994 |

* cited by examiner

VIA CONNECTION TO WIRING IN A SEMICONDUCTOR DEVICE

CROSS-REFERENCE TO RELATED APPLICATION(S)

This application is based upon and claims the benefit of priority from Japanese Patent Application No. 2020-029592, filed Feb. 25, 2020, the entire contents of which are incorporated herein by reference.

FIELD

Embodiments described herein relate generally to a semiconductor device.

BACKGROUND

In formation of a via plug on a wiring, a material for the wiring may easily react with a material for the via plug. In this case, it is necessary to prevent the reaction of the material for the wiring with the material for the via plug.

DETAILED DESCRIPTION

Figure 1A:
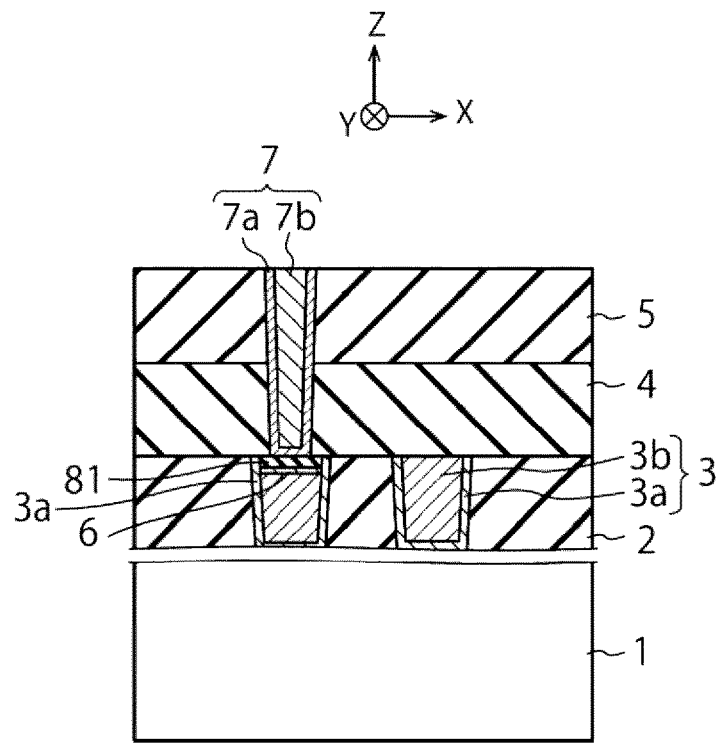
FIG. 1A is a cross-sectional view of a first example of a structure of a semiconductor device according to a first embodiment.

At least one embodiment provides a semiconductor device capable of preventing a reaction between a wiring and a plug.

In general, according to at least one embodiment, a semiconductor device includes a first substrate, a logical circuit, a first insulating film, a wiring, a plug, and a first layer. The logical circuit is disposed on the first substrate. The first insulating film is disposed above the logical circuit. The wiring includes a first film disposed in the first insulating film, the first film extending in a first direction along an upper surface of the first substrate, and the first film contains a metal, and a first metal layer that is disposed in the first insulating film via the first film. The plug is provided under the wiring, extends in a second direction that intersects the first direction, and is electrically connected to the wiring. The first layer is disposed between an upper end of the plug and a lower end of the wiring, and contains a metal oxide or a metal nitride.

Hereinafter, embodiments will be described with reference to the drawings. In FIGS. 1A to 14B, the same or similar elements are given the same reference numeral, and duplicated description is omitted.

First Embodiment

Figure 1B:
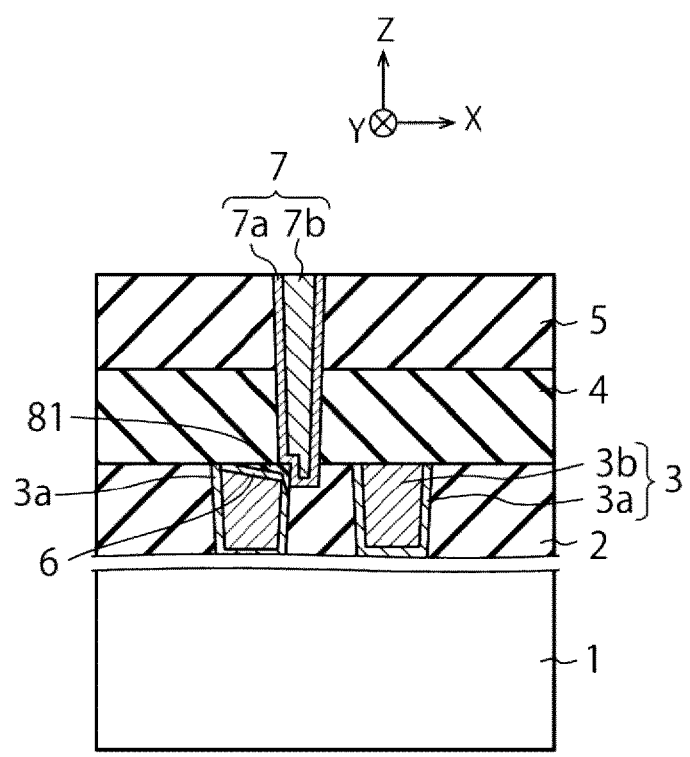
FIG. 1B is a cross-sectional view of a second example of the structure of the semiconductor device according to the first embodiment.

FIG. 1A is a cross-sectional view of a first example of a structure of a semiconductor device according to a first embodiment. FIG. 1B is a cross-sectional view of a second example of the structure of the semiconductor device according to the first embodiment. As illustrated in FIGS. 1A and 1B, the semiconductor device according to the first embodiment includes a substrate 1, a first interlayer insulating film 2 that is an example of the first insulating film, a plurality of wirings 3, a second interlayer insulating film 4 and a third interlayer insulating film 5 that are examples of a second insulating film, a via plug 7 that is an example of the plug, a metal layer 6 that is an example of a second metal layer, and a metal oxide layer 81 that is an example of the first layer containing a metal oxide or a metal nitride.

FIG. 1A illustrates the semiconductor device in which the via plug 7 is formed on any of the wirings 3 without shifting a position of the via plug 7. FIG. 1B illustrates the semiconductor device in which the via plug 7 is shifted on any of the wirings 3. Hereinafter, a structure of the semiconductor device according to the first embodiment will be described with reference to FIG. 1A. The description refers to FIG. 1B as appropriate.

For example, the substrate 1 is a semiconductor substrate such as a silicon (Si) substrate. In FIG. 1A, an X direction and a Y direction that are parallel to a surface of the substrate 1 and are perpendicular to each other, and a Z direction that is perpendicular to the surface of the substrate 1 are shown. In this specification, a +Z direction is used as an upward direction, and a −Z direction is used as a downward direction. The −Z direction may be the same as or different from a direction of gravity. The Y direction is an example of the first direction along an upper surface of a following first substrate (substrate 15). The Z direction is an example of the second direction that intersects the first direction.

The first interlayer insulating film 2 is formed on the substrate 1. For example, the first interlayer insulating film 2 is a silicon oxide film ($SiO_2$ film). The first interlayer insulating film 2 may be formed on the substrate 1 directly or through another layer.

The plurality of wirings 3 are provided in a wiring layer that is provided above the substrate 1, and are formed in the first interlayer insulating film 2. In FIG. 1A, two wirings 3 are shown as an example. The two wirings 3 extend in the Y direction, and are arranged in the X direction at an interval. The wirings 3 each have a first barrier metal film 3a that is an example of the first film containing a metal, and a wiring metal layer 3b that is an example of the first metal layer, and is arranged in the first interlayer insulating film 2 through the first barrier metal film 3a. For example, the wiring metal layer 3b may be a metal layer containing copper (Cu). The first barrier metal film 3a is provided in order to prevent diffusion of a component (e.g., copper) that is contained in the wiring metal layer 3b in the first interlayer insulating film 2. For example, the first barrier metal film 3a may contain titanium (Ti). The wirings 3 can be formed by forming a plurality of openings that extend in the Y direction and are arranged in the X direction at an interval in the first interlayer insulating film 2, and placing the wiring metal layer 3b through the first barrier metal film 3a in the formed openings. The wirings 3 are not limited to an aspect of FIG. 1A. For example, the wirings 3 may be a metal pad (Cu pad), or a metal plug (Cu plug) such as a contact plug or a via plug.

The metal layer 6 is formed on any of the wirings 3. In the example of FIG. 1A, the metal layer 6 is formed on the wiring metal layer 3b of the wiring 3 that is under the via plug 7. Specifically, a lower portion of the metal layer 6 may be in contact with the wiring metal layer 3b, and a side portion of the metal layer 6 may be in contact with the first barrier metal film 3a. The metal layer 6 contains a component (e.g., titanium) that is contained in the first barrier metal film 3a. For example, the wirings 3, the second interlayer insulating film 4, and the third interlayer insulating film 5 are formed, and a via hole is then formed in the second interlayer insulating film 4 and the third interlayer insulating film 5 for formation of the via plug 7. The first barrier metal film 3a may be annealed in an atmosphere containing any of nitrogen ($N_2$), hydrogen ($H_2$), and argon (Ar). Thus, the metal layer 6 can be formed. More specifically, the first barrier metal film 3a is annealed, and as a result, the component (e.g., titanium) that is contained in the first barrier metal film 3a is diffused in an upper end portion of the wiring metal layer 3b, to form the metal layer 6 that contains the diffused component. As illustrated in FIG. 1A, the thickness of a lower portion of the first barrier metal film 3a of the wiring 3 that includes the metal layer 6 is smaller than that of a lower portion of the first barrier metal film 3a of the wiring 3 that does not include the metal layer 6.

In FIG. 1B, a via hole is shifted relative to the left wiring 3 when the via hole is formed in the second interlayer insulating film 4 and the third interlayer insulating film 5 for formation of the via plug 7. As a result, only a right upper end of the left wiring 3 is exposed to the via hole, and comes into contact with the atmosphere containing nitrogen, hydrogen, or argon. In this case, diffusion of the component that is contained in the first barrier metal film 3a is locally promoted at the right upper end side of the wiring 3 that is exposed to the via hole, as illustrated in FIG. 1B. The thickness of the metal layer 6 is increased. In contrast, the thickness of the metal layer 6 is decreased toward a left upper end side of the wiring 3 that is covered with the second interlayer insulating film 4.

The metal oxide layer 81 is formed on the wiring 3 under the via plug 7 to prevent a reaction between the wiring 3 and the via plug 7. In the example of FIG. 1A, the metal oxide layer 81 is formed on the metal layer 6. Specifically, a lower portion of the metal oxide layer 81 is adjacent to the metal layer 6, and a side portion of the metal oxide layer 81 is adjacent to the first barrier metal film 3a. In the example of FIG. 1A, a position of an upper end of the metal oxide layer 81 corresponds to a position of an upper end of the first barrier metal film 3a and a position of an upper end of the first interlayer insulating film 2 in the Z direction. The metal oxide layer 81 contains an oxide of the component (e.g., titanium) that is contained in the metal layer 6. For example, the metal oxide layer 81 contains titanium oxide (TiOx). Such a metal oxide layer 81 can be formed, for example, by forming the metal layer 6, and annealing the metal layer 6 in an atmosphere containing oxygen, resulting in oxidation. When almost all of the metal layer 6 is replaced by oxidation to produce the metal oxide layer 81, the lower portion of the metal oxide layer 81 may be directly adjacent to the wiring metal layer 3b without the metal layer 6. The metal oxide layer 81 may be formed on the wiring 3 by a film formation process that is not based on a reaction (oxidation, etc.) of the metal layer 6 or does not depend on the metal layer 6.

When only the right upper end of the wiring 3 is exposed to the via hole due to shifting of the position of the via hole, and comes into contact with the atmosphere containing oxygen, as illustrated in FIG. 1B, the oxidation of the metal layer 6 is locally promoted at the right upper end side of the wiring 3, and the thickness of the metal oxide layer 81 is increased. In this case, the thickness of the metal oxide layer 81 is decreased toward the left upper end side of the wiring 3 that is covered with the second interlayer insulating film 4.

The second interlayer insulating film 4 and the third interlayer insulating film 5 may be formed in turn on the first interlayer insulating film 2 or the wirings 3. For example, the second interlayer insulating film 4 is a silicon carbide nitride film (SiCN film). For example, the third interlayer insulating film 5 is a silicon oxide film.

The via plug 7 is formed on any of the wirings 3 in the second interlayer insulating film 4 and the third interlayer insulating film 5. In the example of FIG. 1A, the via plug 7 is formed on the wiring 3 in which the metal oxide layer 81 is formed. A bottom end of the via plug 7 is in contact with the metal oxide layer 81. That is, the metal oxide layer 81 is formed between the bottom end of the via plug 7 and an upper end of the wiring 3. As described above, the metal layer 6 may be formed between the metal oxide layer 81 and the upper end of the wiring 3. FIG. 1A shows the via plug 7 that is formed on the left wiring 3. In the example of FIG. 1A, the via plug 7 extends in the Z direction on the left wiring 3. For example, the via plug 7 has a second barrier metal film 7a that is an example of a metal nitride film and a plug metal layer 7b that is an example of a third metal layer. For example, the second barrier metal film 7a is a barrier metal film containing titanium nitride (TiN) or tungsten nitride (WN). For example, the plug metal layer 7b is a tungsten plug material layer containing tungsten (W). The via plug 7 can be obtained by forming a via hole that reaches the wiring 3 having the metal oxide layer 81 in the second interlayer insulating film 4 and the third interlayer insulating film 5, and forming the second barrier metal film 7a and the plug metal layer 7b in turn in the via hole.

In FIG. 1B, the via hole is shifted relative to the left wiring 3 when the via hole is formed in the second interlayer insulating film 4 and the third interlayer insulating film 5. Therefore, the second barrier metal film 7a is formed on a side surface of the left wiring 3. As a result, the plug metal layer 7b is formed on side surfaces of the second interlayer insulating film 4 and the third interlayer insulating film 5 and a surface of the first interlayer insulating film 2 through the second barrier metal film 7a, and on an upper surface and a side surface of the left wiring 3 through the second barrier metal film 7a. The semiconductor device according to the first embodiment may have any of structures illustrated in FIGS. 1A and 1B.

The semiconductor device according to the first embodiment may be any semiconductor device. For example, the semiconductor device may be a three-dimensional semiconductor memory. In this case, the three-dimensional semiconductor memory may be formed by attaching an array chip including a memory cell array and a circuit chip including a CMOS circuit. The wiring 3 and the via plug 7 in FIG. 1A or 1B may be provided in the array chip or the circuit chip. The semiconductor device according to the first embodiment may not include the substrate 1. An example of such a semiconductor device will be described in a third embodiment.

Production Method

Next, a method for producing the semiconductor device having the aforementioned configuration according to the first embodiment will be described with reference to FIGS. 2 to 8B.

Figure 2:
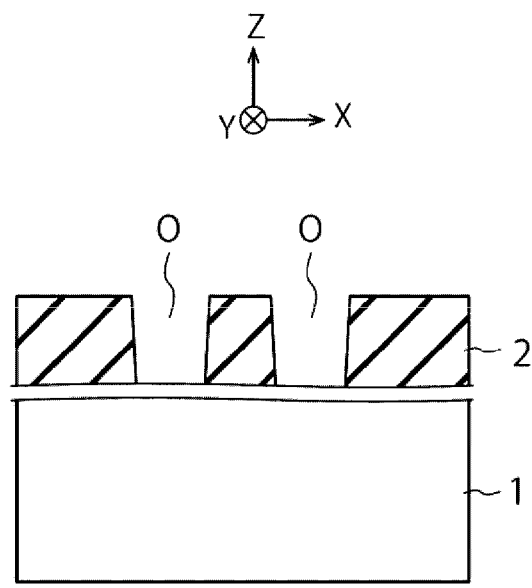
FIG. 2 is a cross-sectional view illustrating a method for producing the semiconductor device of each of FIGS. 1A and 1B according to at least one embodiment.

FIG. 2 is a cross-sectional view illustrating a method for producing the semiconductor device of each of FIGS. 1A and 1B. As illustrated in FIG. 2, the first interlayer insulating film 2 is formed on the substrate 1, and a plurality of openings O that each extend in the Y direction and are arranged in the X direction at an interval are then formed in the first interlayer insulating film 2. The openings O are an example of a first opening. For example, the openings are formed by a lithography technique.

Figure 3:
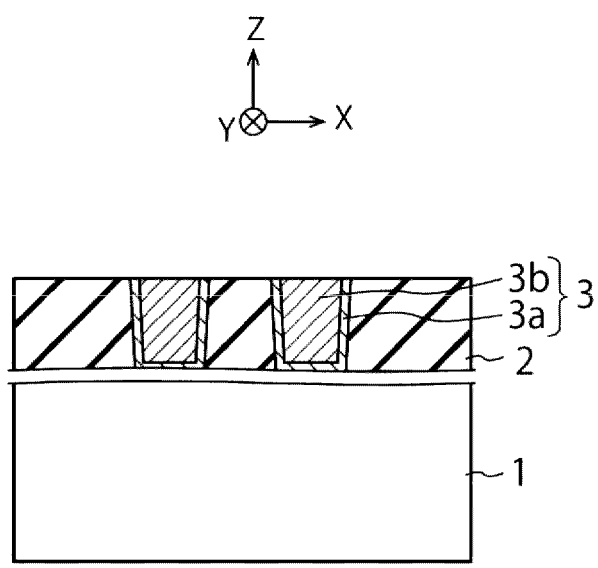
FIG. 3 is a cross-sectional view illustrating the method for producing the semiconductor device of each of FIGS. 1A and 1B that is subsequent to FIG. 2 according to at least one embodiment.

FIG. 3 is a cross-sectional view illustrating the method for producing the semiconductor device of each of FIGS. 1A and 1B that is subsequent to FIG. 2. After the openings O are formed in the first interlayer insulating film 2, the plurality of wirings 3 is formed by forming the wiring metal layer 3b in each of the openings O through the first barrier metal film 3a, as illustrated in FIG. 3. For example, the first barrier metal film 3a is formed by sputtering. For example, the wiring metal layer 3b is formed by a Cu-plating process. For example, the wiring metal layer 3b may be formed on the first barrier metal film 3a through a Cu-seed layer that has been formed on the first barrier metal film 3a by sputtering.

Figure 4A:
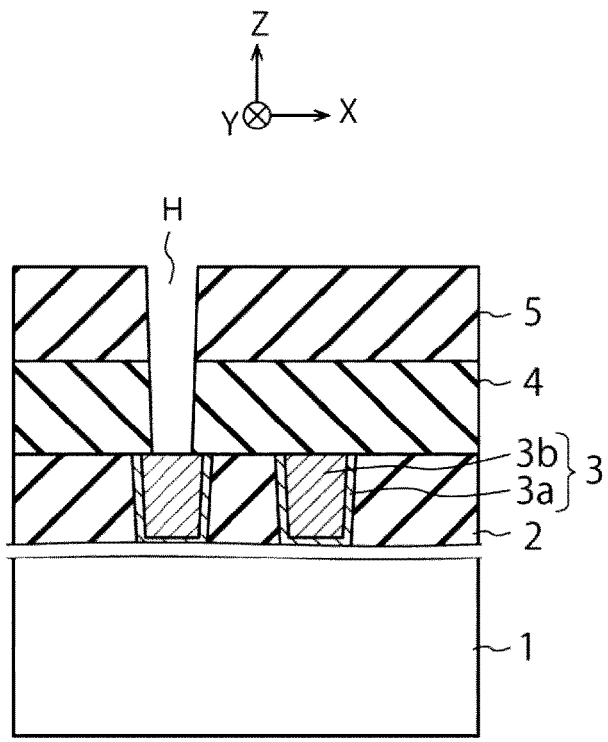
FIG. 4A is a cross-sectional view illustrating the method for producing the semiconductor device of FIG. 1A that is subsequent to FIG. 3 according to at least one embodiment.
Figure 4B:
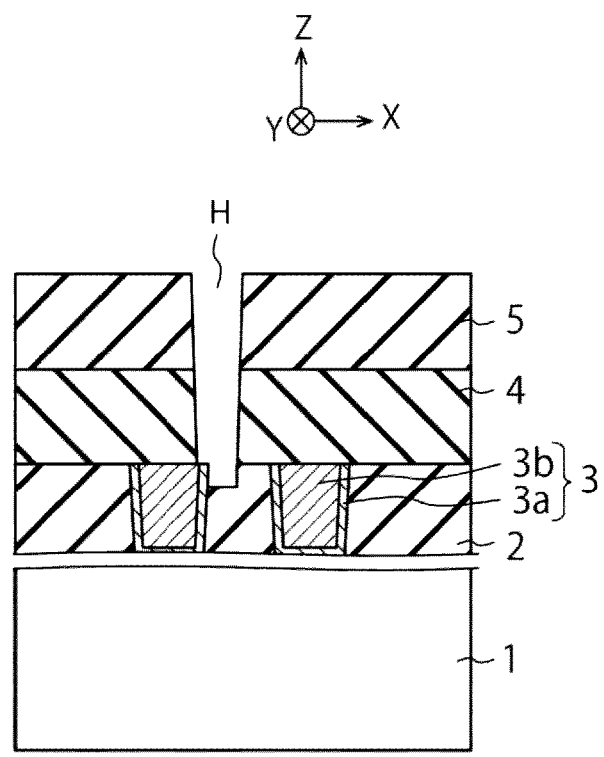
FIG. 4B is a cross-sectional view illustrating the method for producing the semiconductor device of FIG. 1B that is subsequent to FIG. 3 according to at least one embodiment.

FIG. 4A is a cross-sectional view illustrating the method for producing the semiconductor device of FIG. 1A that is subsequent to FIG. 3. FIG. 4B is a cross-sectional view illustrating the method for producing the semiconductor device of FIG. 1B that is subsequent to FIG. 3. After the wirings 3 are formed, the second interlayer insulating film 4 and the third interlayer insulating film 5 are formed in turn on the first interlayer insulating film 2 and the wirings 3, as illustrated in FIG. 4A. After the second interlayer insulating film 4 and the third interlayer insulating film 5 are formed, a via hole H that reaches any of the wirings 3 (that is, the wiring 3 in which the metal oxide layer 81 is to be formed) is formed in the second interlayer insulating film 4 and the third interlayer insulating film 5, as illustrated in FIG. 4A. The via hole H is an example of a second opening. When the via hole H is formed, an upper surface of the wiring 3 is exposed in the via hole H. For example, the via hole H is formed by a lithography technique. In FIG. 4B, the via hole H is shifted relative to the wiring 3, and the upper surface and a side surface of the wiring 3 are exposed in the via hole H.

Figure 5A:
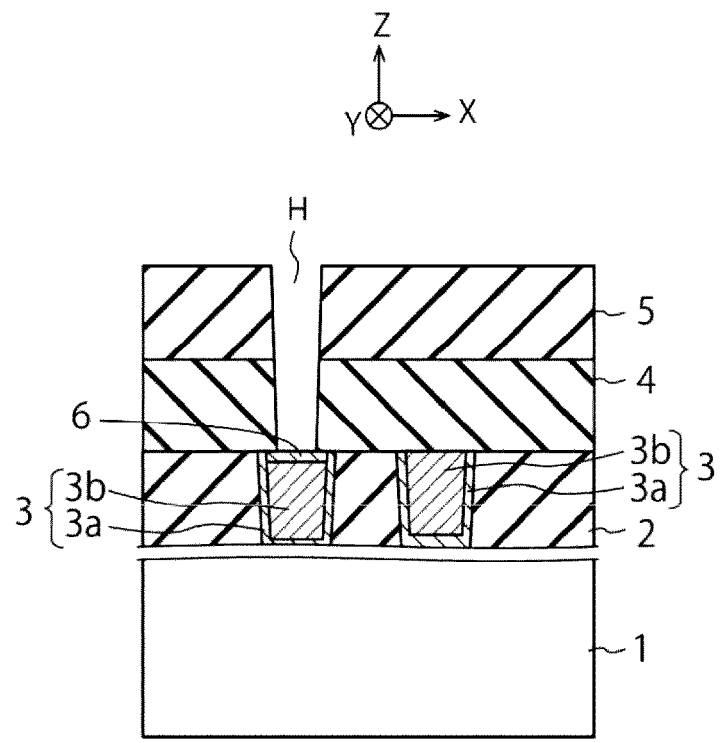
FIG. 5A is a cross-sectional view illustrating the method for producing the semiconductor device of FIG. 1A that is subsequent to FIG. 4A according to at least one embodiment.
Figure 5B:
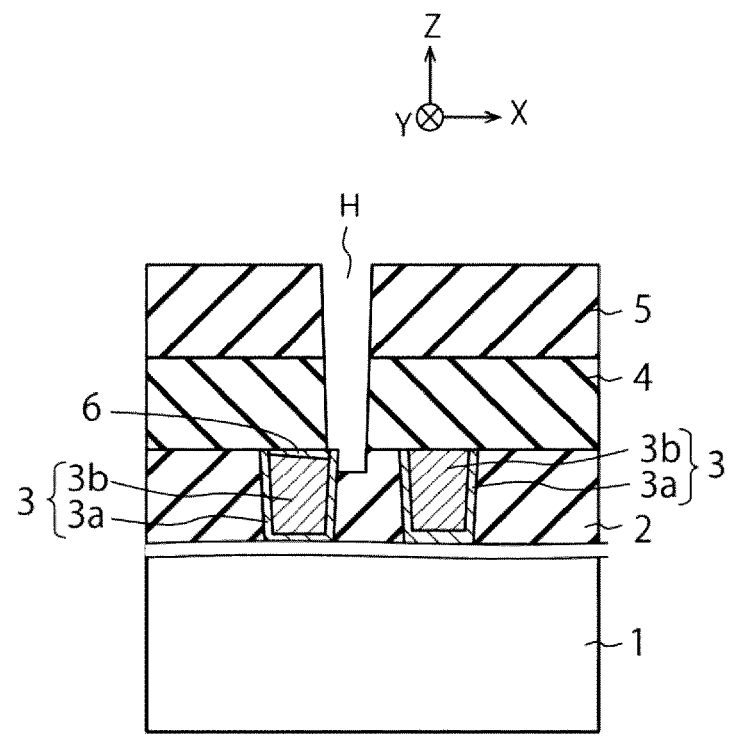
FIG. 5B is a cross-sectional view illustrating the method for producing the semiconductor device of FIG. 1B that is subsequent to FIG. 4B according to at least one embodiment.

FIG. 5A is a cross-sectional view illustrating the method for producing the semiconductor device of FIG. 1A that is subsequent to FIG. 4A. FIG. 5B is a cross-sectional view illustrating the method for producing the semiconductor device of FIG. 1B that is subsequent to FIG. 4B. After the via hole H is formed, the metal layer 6 that contains the component (e.g., titanium) contained in the first barrier metal film 3a is formed at the upper end of the wiring 3 that is exposed to the via hole H, as illustrated in FIG. 5A. For example, the first barrier metal film 3a is annealed in an atmosphere containing any of nitrogen, hydrogen, or argon, the component (e.g., titanium) contained in the first barrier metal film 3a is then diffused in the upper end of the wiring 3, that is, the wiring metal layer 3b to predetermined depth due to the annealing, and as a result, the metal layer 6 is formed. In FIG. 5B, the via hole H is shifted relative to the wiring 3. Therefore, the thickness of the metal layer 6 is increased at the right upper end side of the wiring 3 that is exposed in the via hole H, and the thickness of the metal layer 6 is decreased toward the left upper end side of the wiring 3.

Figure 6A:
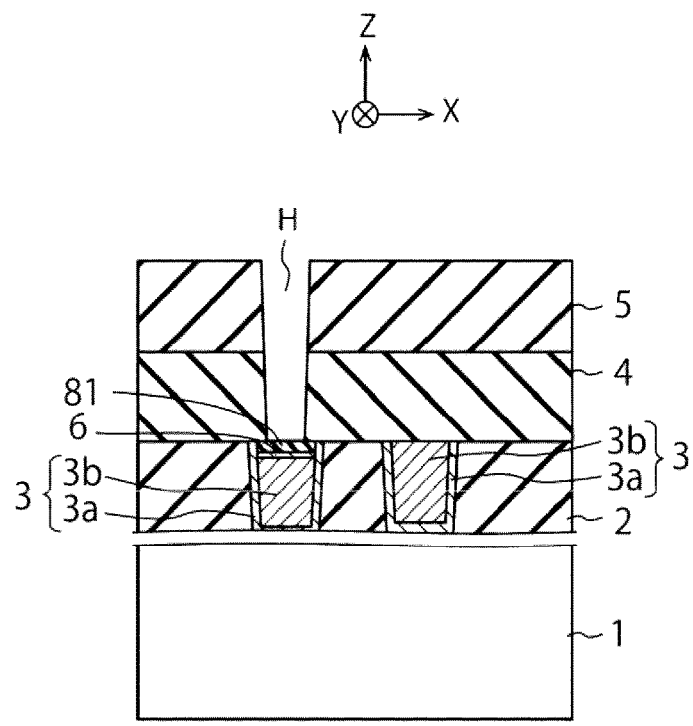
FIG. 6A is a cross-sectional view illustrating the method for producing the semiconductor device of FIG. 1A that is subsequent to FIG. 5A according to at least one embodiment.
Figure 6B:
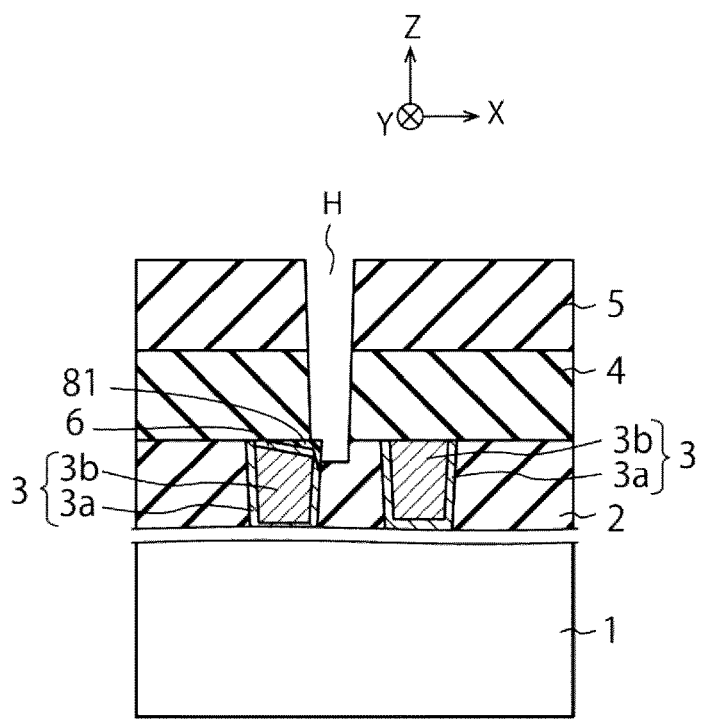
FIG. 6B is a cross-sectional view illustrating the method for producing the semiconductor device of FIG. 1B that is subsequent to FIG. 5B according to at least one embodiment.

FIG. 6A is a cross-sectional view illustrating the method for producing the semiconductor device of FIG. 1A that is subsequent to FIG. 5A. FIG. 6B is a cross-sectional view illustrating the method for producing the semiconductor device of FIG. 1B that is subsequent to FIG. 5B. After the metal layer 6 is formed, the metal layer 6 is oxidized to form the metal oxide layer 81 on the wiring 3, as illustrated in FIG. 6A. The oxidation of the metal layer 6 to form the metal oxide layer 81 can decrease the number of steps required for formation of the metal oxide layer 81. The oxidation of the metal layer 6 is carried out by annealing the metal layer 6 in an atmosphere containing oxygen. In FIG. 6B, the via hole H is shifted relative to the wiring 3. Therefore, the thickness of the metal oxide layer 81 is increased at the right upper end side of the wiring 3 that is exposed in the via hole H, and the thickness of the metal oxide layer 81 is decreased toward the left upper end side of the wiring 3.

Figure 7A:
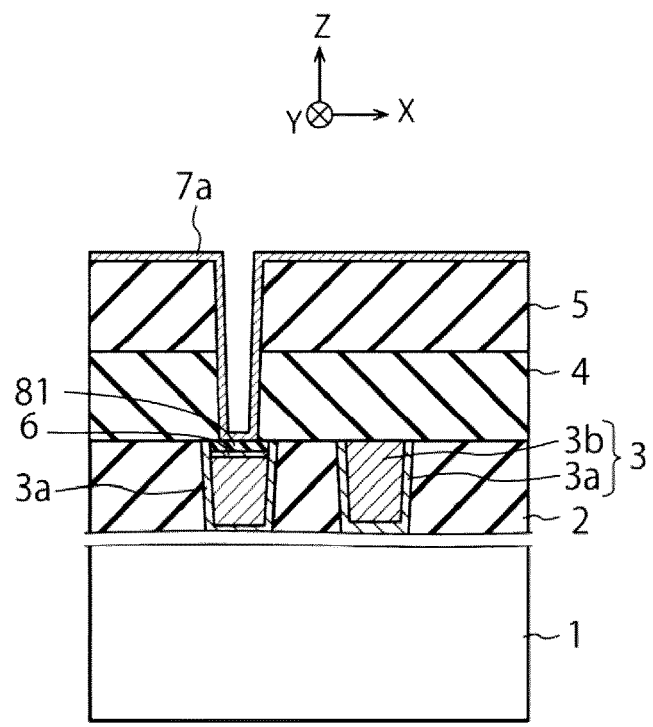
FIG. 7A is a cross-sectional view illustrating the method for producing the semiconductor device of FIG. 1A that is subsequent to FIG. 6A according to at least one embodiment.
Figure 7B:
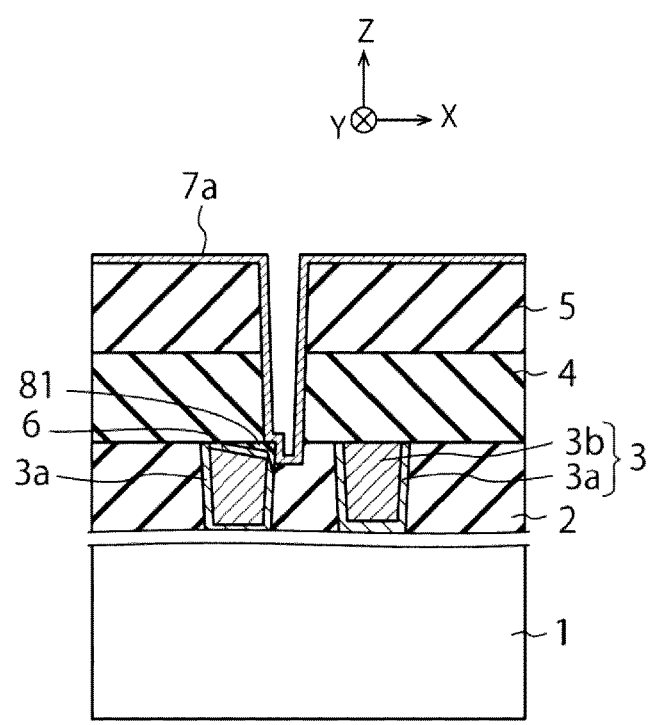
FIG. 7B is a cross-sectional view illustrating the method for producing the semiconductor device of FIG. 1B that is subsequent to FIG. 6B according to at least one embodiment.

FIG. 7A is a cross-sectional view illustrating the method for producing the semiconductor device of FIG. 1A that is subsequent to FIG. 6A. FIG. 7B is a cross-sectional view illustrating the method for producing the semiconductor device of FIG. 1B that is subsequent to FIG. 6B. After the metal oxide layer 81 is formed, the second barrier metal film 7a is formed in the via hole H and on the third interlayer insulating film 5, as illustrated in FIG. 7A. When the second barrier metal film 7a contains titanium nitride, the second barrier metal film 7a is formed by a thermal chemical vapor deposition (CVD) method or a plasma CVD method using a material gas containing chlorine. For example, the material gas containing chlorine is a gas containing titanium tetrachloride ($TiCl_4$). When the second barrier metal film 7a contains tungsten nitride, the second barrier metal film 7a is formed by a thermal CVD method or a plasma CVD method using a material gas containing fluorine. In FIG. 7B, the second barrier metal film 7a is also formed on a side surface of the wiring 3.

Figure 8A:
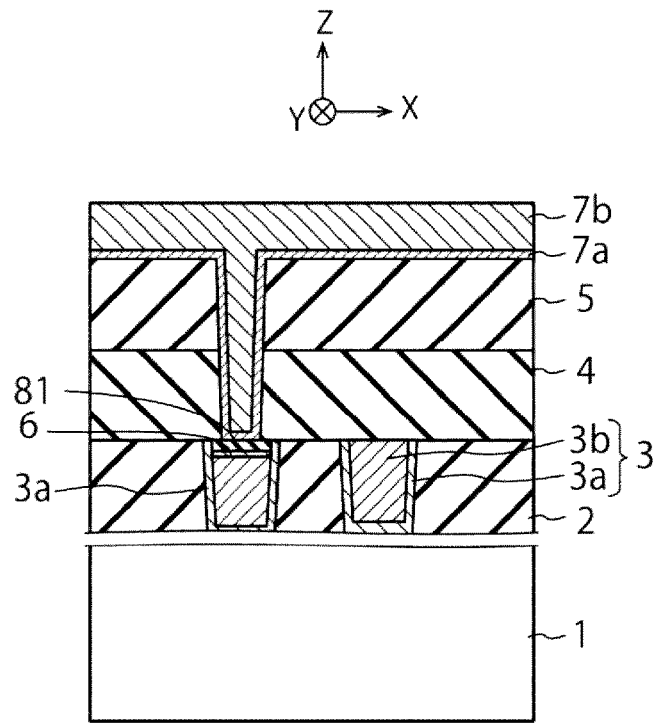
FIG. 8A is a cross-sectional view illustrating the method for producing the semiconductor device of FIG. 1A that is subsequent to FIG. 7A according to at least one embodiment.
Figure 8B:
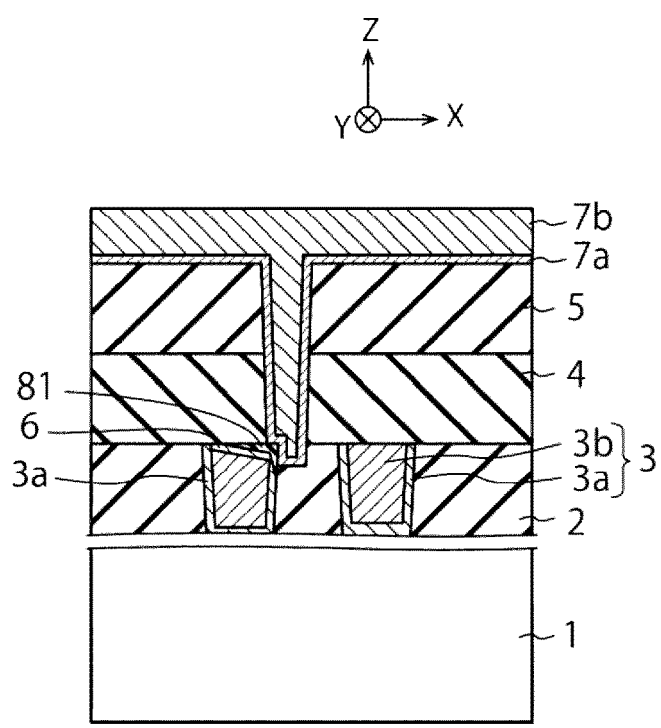
FIG. 8B is a cross-sectional view illustrating the method for producing the semiconductor device of FIG. 1B that is subsequent to FIG. 7B according to at least one embodiment.

FIG. 8A is a cross-sectional view illustrating the method for producing the semiconductor device of FIG. 1A that is subsequent to FIG. 7A. FIG. 8B is a cross-sectional view illustrating the method for producing the semiconductor device of FIG. 1B that is subsequent to FIG. 7B. After the second barrier metal film 7a is formed, the plug metal layer 7b is formed on the second barrier metal film 7a, as illustrated in FIG. 8A. For example, the plug metal layer 7b is formed by a CVD method. In FIG. 8B, the plug metal layer 7b is also formed on the side surface of the wiring 3 through the second barrier metal film 7a.

After the plug metal layer 7b is formed, a surface of the plug metal layer 7b is planarized. At that time, the plug metal layer 7b and the second barrier metal film 7a outside the via hole H are removed, to form the via plug 7 in the via hole H (FIGS. 1A and 1B). When the via plug 7 is formed in contact with the wiring 3, the via plug 7 is electrically connected to the wiring 3. In planarizing the plug metal layer 7b, for example, chemical mechanical polishing (CMP) is performed. Subsequently, various interlayer insulating films, a wiring layer, a plug metal layer, and the like are formed on the substrate 1. Thus, the semiconductor device of at least one embodiment is produced.

When the second barrier metal film 7a is formed using a material gas containing chlorine or fluorine without forming the metal oxide layer 81 on the wiring 3, residual chlorine or residual fluorine reacts with the component (e.g., titanium) contained in the first barrier metal film 3a, to decrease adhesion between the first barrier metal film 3a and the wiring metal layer 3b. As a result, the wiring metal layer 3b is shifted. Due to the shifted wiring metal layer 3b, a void may be generated between the first barrier metal film 3a and the wiring metal layer 3b. Due to the generated void, the electric resistance of the wiring 3 is largely changed from a set value, and wiring reliability may be deteriorated.

In the semiconductor device according to the first embodiment, the metal oxide layer 81 that has low reactivity with chlorine and fluorine is formed between the bottom end of the via plug 7 and the upper end of the wiring 3. Therefore, the metal oxide layer 81 can prevent a reaction of residual chlorine or residual fluorine with the component (titanium) contained in the first barrier metal film 3a. Accordingly, the generation of void can be prevented to secure the wiring reliability. When the metal oxide layer 81 is provided in contact with the bottom end of the via plug 7, the reaction of residual chlorine or residual fluorine with the component (titanium) contained in the first barrier metal film 3a can be effectively prevented.

Second Embodiment

Figure 9A:
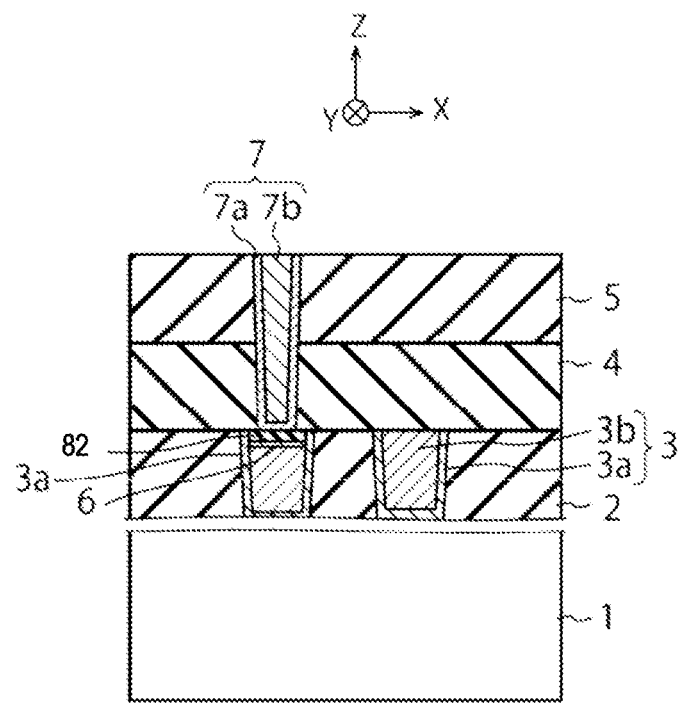
FIG. 9A is a cross-sectional view of a first example of a structure of a semiconductor device according to a second embodiment.
Figure 9B:
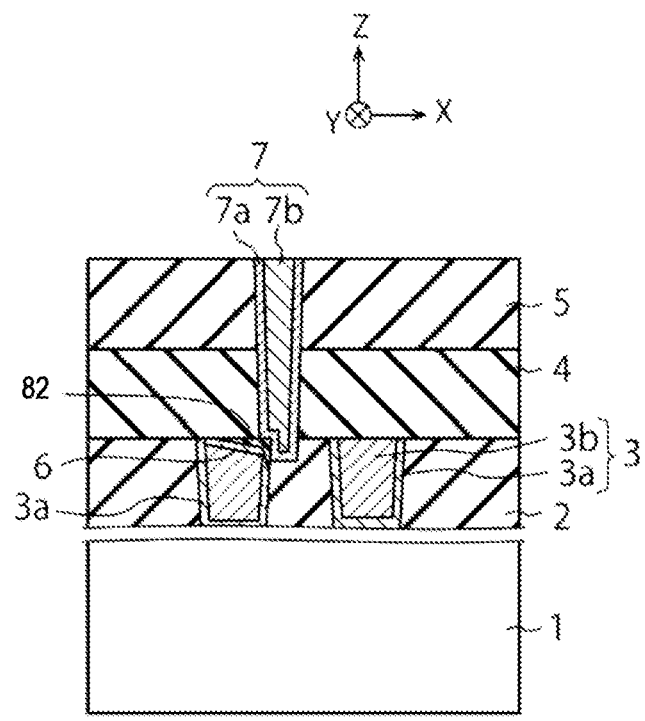
FIG. 9B is a cross-sectional view of a second example of the structure of the semiconductor device according to the second embodiment.

A semiconductor device according to a second embodiment that includes a metal nitride layer as an example of a metal oxide/nitride layer will be described hereinafter. FIG. 9A is a cross-sectional view of a first example of the structure of the semiconductor device according to the second embodiment. FIG. 9B is a cross-sectional view of a second example of the structure of the semiconductor device according to the second embodiment.

Unlike the semiconductor device according to the first embodiment, the semiconductor device according to the second embodiment includes a metal nitride layer 82 as an example of a metal oxide/nitride layer instead of the metal oxide layer 81. A position where the metal nitride layer 82 is formed is between the bottom end of the via plug 7 and the upper end of the wiring 3, like the metal oxide layer 81. For example, the metal nitride layer 82 contains titanium nitride (TiN). For example, the metal nitride layer 82 can be formed by forming the metal layer 6 on the wiring 3, as illustrated in FIGS. 5A and 5B, and nitriding the formed metal layer 6. The nitridation of the metal layer 6 to form the metal nitride layer 82 can decrease the number of steps required for formation of the metal nitride layer 82. For example, the nitridation of the metal layer 6 can be carried out by an annealing treatment or a plasma treatment of the metal layer 6 in an atmosphere containing ammonia ($NH_3$).

In the semiconductor device according to the second embodiment, the metal nitride layer 82 that has low reactivity with chlorine and fluorine is formed between the bottom end of the via plug 7 and the upper end of the wiring 3. Therefore, the metal nitride layer 82 can prevent a reaction of residual chlorine or residual fluorine with the component (titanium) contained in the first barrier metal film 3a.

Third Embodiment

Figure 10:
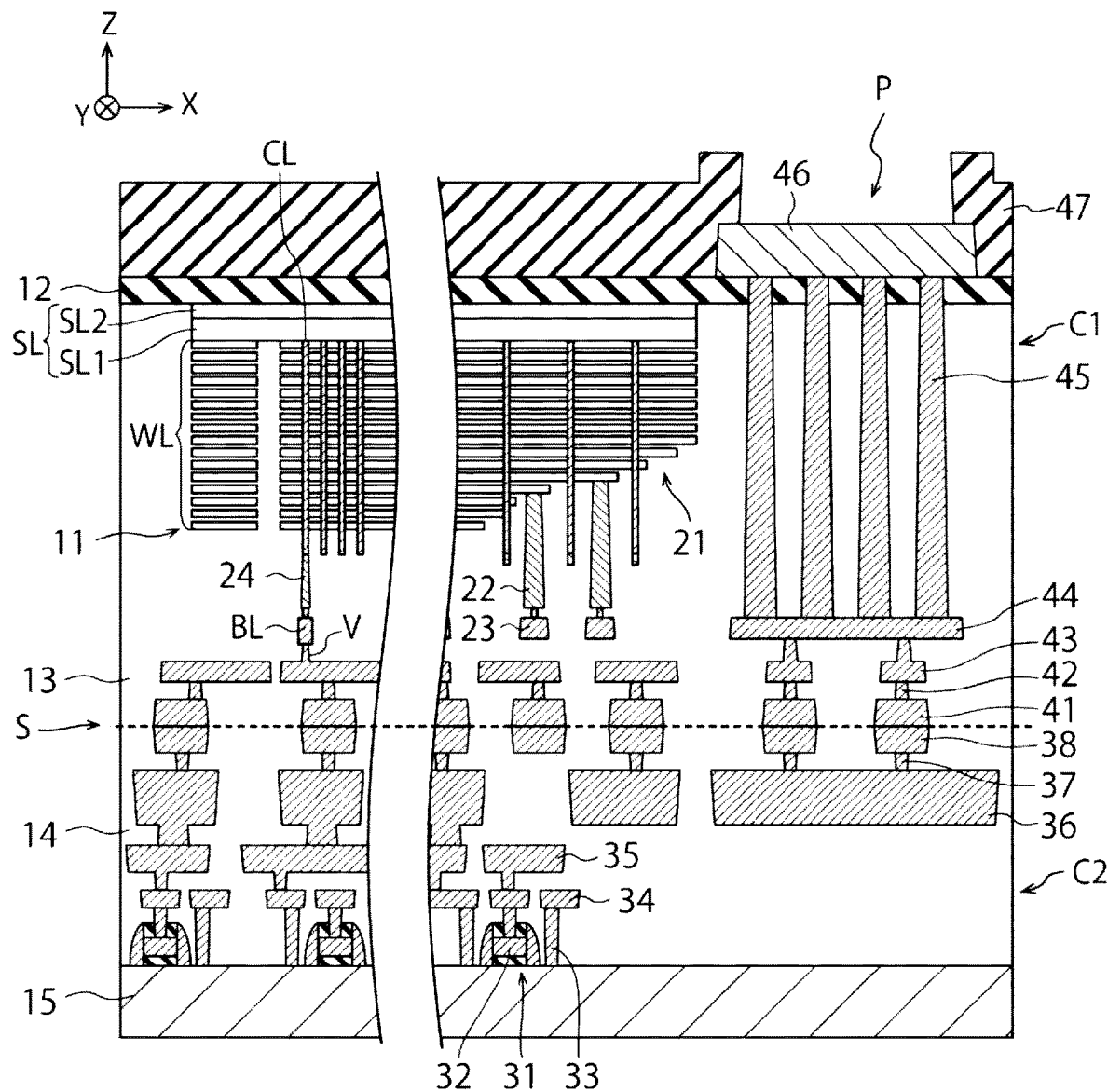
FIG. 10 is a cross-sectional view of a structure of a semiconductor device according to a third embodiment.

FIG. 10 is a cross-sectional view of a structure of a semiconductor device according to a third embodiment. The semiconductor device of FIG. 10 is a three-dimensional memory in which an array chip C1 is attached to a circuit chip C2.

The array chip C1 includes a memory cell array 11 including a plurality of memory cells that are three-dimensionally arranged, an insulating film 12 that is provided on the memory cell array 11, and an interlayer insulating film 13 that is provided below the memory cell array 11. For example, the insulating film 12 is a silicon oxide film or a silicon nitride film. For example, the interlayer insulating film 13 is a silicon oxide film or a layered film including a silicon oxide film and another insulating film.

The circuit chip C2 is provided under the array chip C1. A symbol S represents a sticking interface between the array chip C1 and the circuit chip C2. The circuit chip C2 includes an interlayer insulating film 14 and a substrate 15 that is provided under the interlayer insulating film 14. For example, the interlayer insulating film 14 is a silicon oxide film or a layered film including a silicon oxide film and another insulating film. The substrate 15 is an example of the first substrate and, for example, a semiconductor substrate such as a silicon substrate. In FIG. 10, the X direction and the Y direction that are parallel to a surface, that is, an upper surface of the substrate 15 and are perpendicular to each other, and the Z direction that is perpendicular to the surface of the substrate 15 are shown. The Y direction is an example of the first direction, the X direction is an example of the second direction that intersects the first direction, and the Z direction is an example of a third direction that intersects the first and second directions.

The array chip C1 includes a plurality of word lines WL as a plurality of electrode layers in the memory cell array 11, and a source line SL. In FIG. 10, a stair structure portion 21 of the memory cell array 11 is used. Each of the word lines WL is electrically connected to a word wiring layer 23 through a contact plug 22. A columnar portion CL that penetrates the word lines WL is electrically connected to a bit line BL through a via plug 24, and is electrically connected to the source line SL. The source line SL includes a first layer SL1 that is a semiconductor layer and a second layer SL2 that is a metal layer. A symbol V represents a via plug provided under the bit line BL.

The circuit chip C2 includes a plurality of transistors 31. Each of the transistors 31 includes a gate electrode 32 that is provided on the substrate 15 through a gate insulating film, and a source diffusion layer and a drain diffusion layer that are provided in the substrate 15 and are not shown in the drawings. The circuit chip C2 includes a plurality of contact plugs 33 that are provided on the source diffusion layer or the drain diffusion layer of the transistors 31, a wiring layer 34 that is provided on each of the contact plugs 33 and includes a plurality of wirings, and a wiring layer 35 that is provided on the wiring layer 34 and includes a plurality of wirings.

The circuit chip C2 further includes a wiring layer 36 that is provided on the wiring layer 35 and includes a plurality of wirings, a plurality of via plugs 37 that are provided on the wiring layer 36, and a plurality of metal pads 38 that are provided on the via plugs 37. For example, the metal pads 38 are a copper (Cu) layer or an aluminum (Al) layer. The circuit chip C2 functions as a control circuit (logical circuit) of controlling an operation of the array chip C1. The control circuit includes the transistors 31 and the like, and is electrically connected to the metal pads 38.

The array chip C1 includes a plurality of metal pads 41 that are provided on the metal pads 38, and a plurality of via plugs 42 that are provided on the metal pads 41. The array chip C1 includes a wiring layer 43 that is provided on each of the via plugs 42 and includes a plurality of wirings, and a wiring layer 44 that is provided on the wiring layer 43 and includes a plurality of wirings. For example, the metal pads 41 are a Cu layer or an Al layer. The aforementioned via plug V is disposed in the wiring layer 43.

The array chip C1 further includes a plurality of via plugs 45 that are provided on the wiring layer 44, a metal pad 46 that is provided on the via plugs 45 and the insulating film 12, and a passivation film 47 that is provided on the metal pad 46 and the insulating film 12. For example, the metal pad 46 is a Cu layer or an Al layer, and functions as an exterior connection pad (bonding pad) of the semiconductor device of FIG. 10. For example, the passivation film 47 is an insulating film such as a silicon oxide film, and has an opening P that causes an upper surface of the metal pad 46 to be exposed. The metal pad 46 can be connected to a mounting substrate or another device through the opening P with a bonding wire, a solder ball, a metal bump, or the like.

Figure 11:
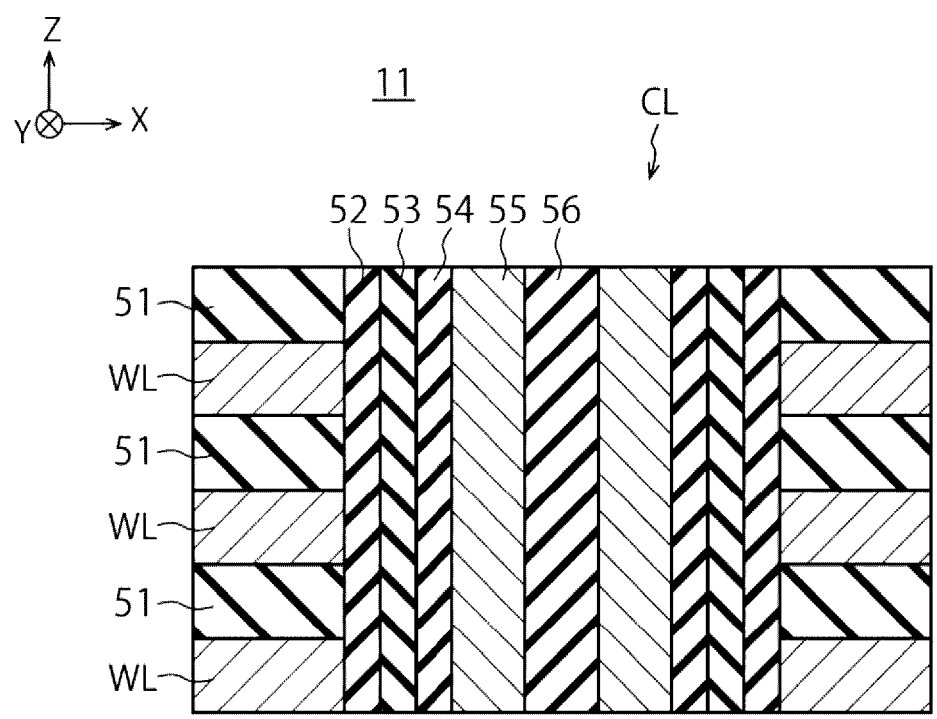
FIG. 11 is a cross-sectional view of a structure of a columnar portion in the semiconductor device according to the third embodiment.

FIG. 11 is a cross-sectional view of a structure of the columnar portion CL in the semiconductor device according to the third embodiment.

As illustrated in FIG. 11, the memory cell array 11 includes the plurality of word lines WL and a plurality of insulating layers 51 that are alternately layered on the interlayer insulating film 13 (FIG. 10). For example, the word lines WL are a tungsten (W) layer. For example, the insulating layers 51 are a silicon oxide film.

The columnar portion CL includes a block insulating film 52, a charge storage layer 53, a tunnel insulating film 54, a channel semiconductor layer 55, and a core insulating film 56. For example, the charge storage layer 53 is a silicon nitride film. The charge storage layer 53 is formed on side surfaces of the word lines WL and the insulating layers 51 through the block insulating film 52. The charge storage layer 53 may be a semiconductor layer such as a polysilicon layer. For example, the channel semiconductor layer 55 is a polysilicon layer. The channel semiconductor layer 55 is formed on a side surface of the charge storage layer 53 through the tunnel insulating film 54. For example, the block insulating film 52, the tunnel insulating film 54, and the core insulating film 56 are a silicon oxide film or a metal insulating film.

Figure 12:
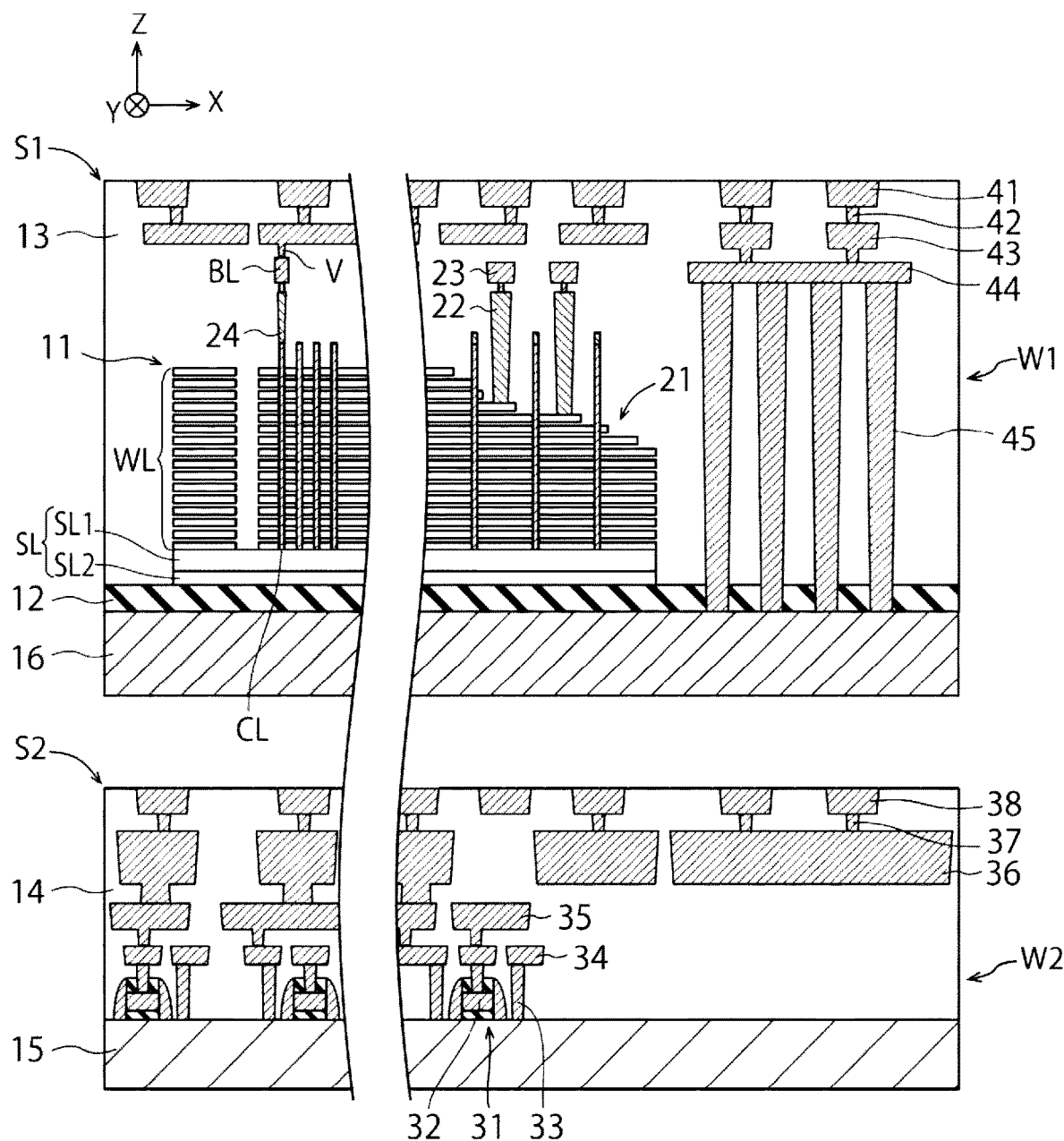
FIG. 12 is a cross-sectional view illustrating a method for producing the semiconductor device according to the third embodiment.

FIG. 12 is a cross-sectional view illustrating a method for producing the semiconductor device according to the third embodiment. In FIG. 12, an array wafer W1 including a plurality of array chips C1 and a circuit wafer W2 including a plurality of circuit chips C2 are shown. The array wafer W1 is also referred to as a memory wafer, and the circuit wafer W2 is also referred to as a CMOS wafer.

A direction of the memory wafer W1 in FIG. 12 is opposite to a direction of the array chip C1 in FIG. 10. In the third embodiment, the array wafer W1 is attached to the circuit wafer W2 to produce the semiconductor device. In FIG. 12, the memory wafer W1 before inversion for attachment is shown. In FIG. 10, the array chip C1 that has been inverted for attachment, attached, and diced is shown.

In FIG. 12, a symbol S1 represents an upper surface of the memory wafer W1, and a symbol S2 represents an upper surface of the circuit wafer W2. The memory wafer W1 includes a substrate 16 that is provided under the insulating film 12. For example, the substrate 16 is a semiconductor substrate such as a silicon substrate. The substrate 16 is an example of a second substrate.

In the third embodiment, the memory cell array 11, the insulating film 12, the interlayer insulating film 13, the stair structure portion 21, and the metal pads 41 may be formed on the substrate 16 of the memory wafer W1, and the interlayer insulating film 14, the transistors 31, and the metal pads 38 may be formed on the substrate 15 of the circuit wafer W2, as illustrated in FIG. 12. For example, the via plugs 45, the wiring layer 44, the wiring layers 43, the via plugs 42, and the metal pads 41 are formed in turn on the substrate 16. The contact plugs 33, the wiring layers 34, the wiring layer 35, the wiring layer 36, the via plugs 37, and the metal pads 38 are formed in turn on the substrate 15. Subsequently, the array wafer W1 is attached to the circuit wafer W2 under mechanical pressure. As a result, the interlayer insulating film 13 is adhered to the interlayer insulating film 14. The array wafer W1 and the circuit wafer W2 are then annealed at 400° C. As a result, the metal pads 41 are bonded to the metal pads 38.

The thickness of the substrate 15 is then decreased by CMP, the substrate 16 is removed by CMP, and the array wafer W1 and the circuit wafer W2 are cut into a plurality of chips. Thus, the semiconductor device of FIG. 10 is produced. For example, the metal pad 46 and the passivation film 47 are formed on the insulating film 12 after the decrease in thickness of the substrate 15 and the removal of the substrate 16.

In this embodiment, the array wafer W1 is attached to the circuit wafer W2. The array wafer W1 may be attached to another array wafer W1. A description previously discussed with reference to FIGS. 10 to 12 and a description discussed below with reference to FIGS. 13A to 14B can be applied to attachment of the array wafers W1.

In FIG. 10, an interface between the interlayer insulating films 13 and 14 and an interface between the metal pads 38 and 41 are shown. After the annealing, the interfaces are not generally observed. However, positions of the interfaces can be estimated, for example, by detecting tilts of side surfaces of the metal pads 41 and 38, or shifting of positions of the side surfaces of the metal pads 41 and 38.

The structure of the semiconductor device according to the first embodiment and the structure of the semiconductor device according to the second embodiment can be applied to the array chip C1 of the third embodiment. Hereinafter, examples of the structures will be described with reference to FIGS. 13A to 14B.

Figure 13A:
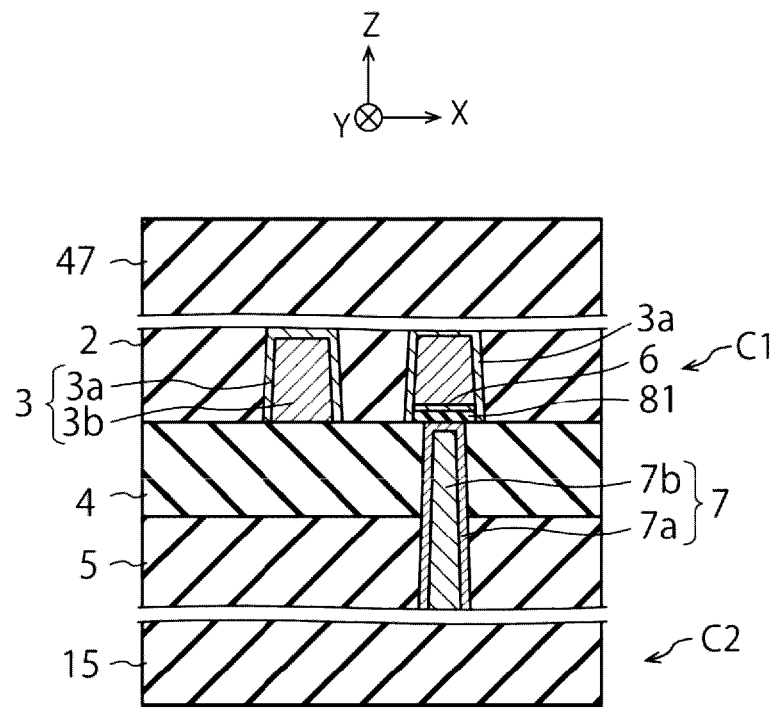
FIG. 13A is a cross-sectional view of a first example of a structure of the semiconductor device according to the third embodiment.
Figure 13B:
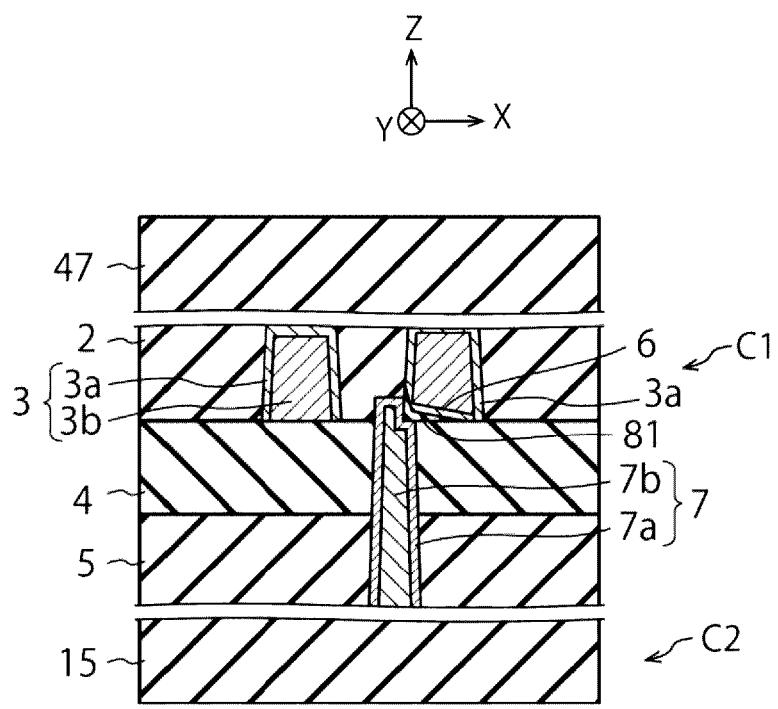
FIG. 13B is a cross-sectional view of a second example of the structure of the semiconductor device according to the third embodiment.

FIG. 13A is a cross-sectional view of a first example of the structure of the semiconductor device according to the third embodiment. FIG. 13B is a cross-sectional view of a second example of the structure of the semiconductor device according to the third embodiment. The semiconductor devices illustrated in FIGS. 13A and 13B are achieved by using the structure of the semiconductor device according to the first embodiment for the array chip C1 of the third embodiment. Specifically, FIG. 13A shows the semiconductor device that is formed without shifting the position of the via plug 7 relative to the wiring 3. FIG. 13B shows the semiconductor device that is formed when the position of the via plug 7 is shifted relative to the wiring 3. The semiconductor devices illustrated in FIGS. 13A and 13B are produced through attachment of the array wafer W1 to the circuit wafer W2. Therefore, the direction of the array chips C1 illustrated in FIGS. 13A and 13B is opposite to the direction of the semiconductor devices illustrated in FIGS. 1A and 1B.

Hereinafter, the structure of the semiconductor device illustrated in FIG. 13A will be described. This description can also be applied to the semiconductor device illustrated in FIG. 13B.

In production of the semiconductor device illustrated in FIG. 13A, the steps of FIGS. 2, 3, 4A, 5A, 6A, 7A, and 8A are performed. Thus, the array wafer W1 having the structure of FIG. 1A is produced. In this case, the first interlayer insulating film 2, the wirings 3, the metal layer 6, the metal oxide layer 81, the second interlayer insulating film 4, the third interlayer insulating film 5, and the via plug 7 may be formed on the substrate 16 instead of the substrate 1.

As described with reference to FIG. 12, the array wafer W1 and the circuit wafer W2 are attached to each other, and then diced. Thus, the semiconductor device of FIG. 13A is produced.

The wirings 3 and the via plug 7 in this example correspond to the bit lines BL and the via plug V in FIG. 10, respectively. In FIG. 1A, the via plug 7 is formed on the wirings 3. In FIGS. 10 and 13A, the via plug 7 (the via plug V) is formed under the wirings 3 (the bit lines BL). In FIG. 1A, the metal oxide layer 81 is formed between the bottom end of the via plug 7 and the upper end of the wiring 3. In FIG. 13A, the metal oxide layer 81 is formed between the upper end of the via plug 7 and the bottom end of the wiring 3.

Figure 14A:
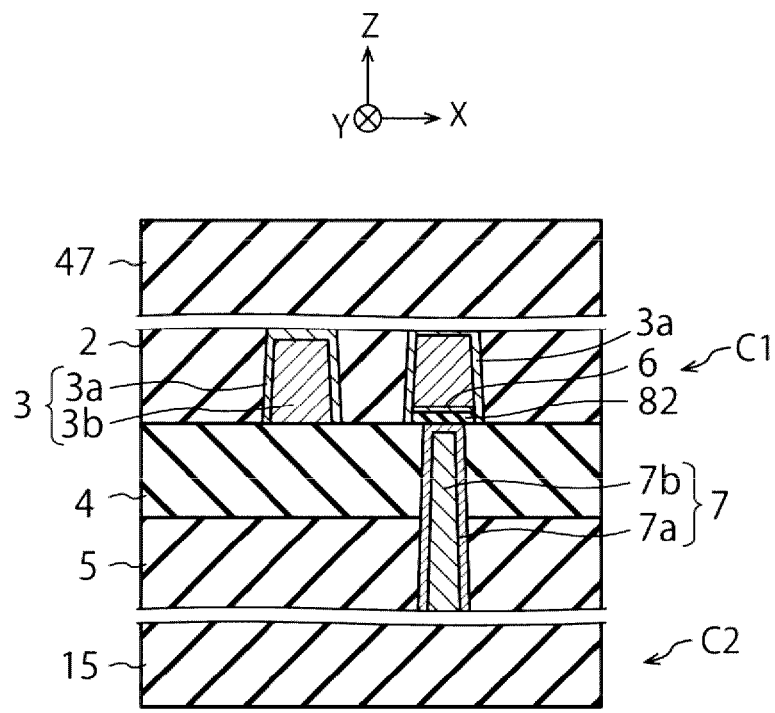
FIG. 14A is a cross-sectional view of a third example of the structure of the semiconductor device according to the third embodiment.
Figure 14B:
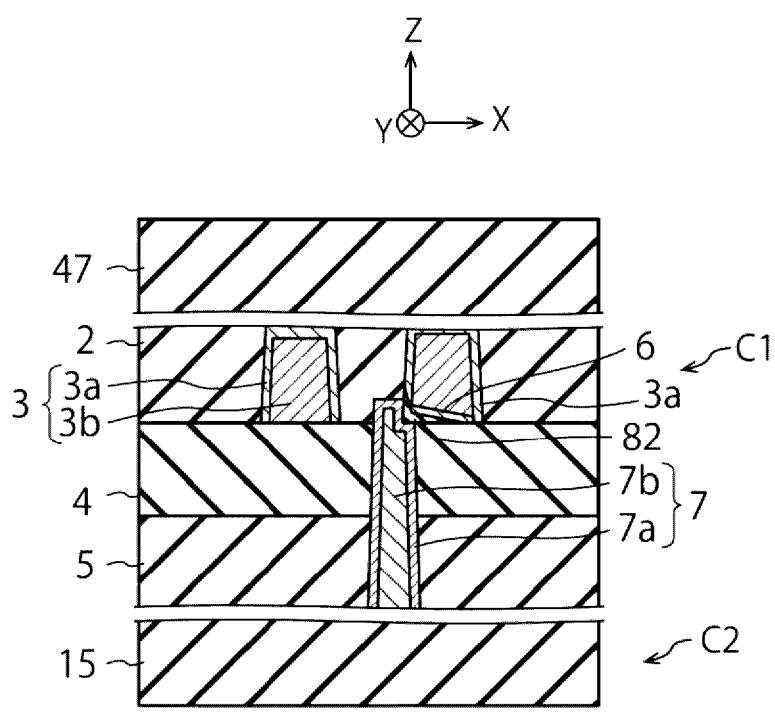
FIG. 14B is a cross-sectional view of a fourth example of the structure of the semiconductor device according to the third embodiment.

FIG. 14A is a cross-sectional view of a third example of the structure of the semiconductor device according to the third embodiment. FIG. 14B is a cross-sectional view of a fourth example of the structure of the semiconductor device according to the third embodiment. The semiconductor devices illustrated in FIGS. 14A and 14B are achieved by using the structure of the semiconductor device according to the second embodiment for the array chip C1 of the third embodiment. FIG. 14A shows the semiconductor device that is formed without shifting the position of the via plug 7 relative to the wiring 3. FIG. 14B shows the semiconductor device that is formed when the position of the via plug 7 is shifted relative to the wiring 3. The semiconductor devices illustrated in FIGS. 14A and 14B are produced through attachment of the array wafer W1 to the circuit wafer W2. Therefore, the direction of the array chips C1 illustrated in FIGS. 14A and 14B is opposite to the direction of the semiconductor devices illustrated in FIGS. 9A and 9B.

Hereinafter, the structure of the semiconductor device illustrated in FIG. 14A will be described. This description can also be applied to the semiconductor device illustrated in FIG. 14B.

In production of the semiconductor device illustrated in FIG. 14A, the array wafer W1 having the structure of FIG. 9A is produced. In this case, the first interlayer insulating film 2, the wirings 3, the metal layer 6, the metal nitride layer 82, the second interlayer insulating film 4, the third interlayer insulating film 5, and the via plug 7 are formed on the substrate 16 instead of the substrate 1.

As described with reference to FIG. 12, the array wafer W1 and the circuit wafer W2 are attached to each other, and then diced. Thus, the semiconductor device of FIG. 14A is produced.

The wirings 3 and the via plug 9 in this example correspond to the bit lines BL and the via plug V illustrated in FIG. 10, respectively. In FIG. 9A, the via plug 7 is formed on the wirings 3. In FIGS. 10 and 14A, the via plug 7 (the via plug V) is formed under the wirings 3 (the bit lines BL). In FIG. 9A, the metal nitride layer 82 is formed between the bottom end of the via plug 7 and the upper end of the wirings 3. In FIG. 14A, the metal nitride layer 82 is formed between the upper end of the via plug 7 and the bottom end of the wirings 3.

As described above, the semiconductor device according to the third embodiment includes the metal oxide layer 81 or the metal nitride layer 82 between the upper end of the via plug 7 and the bottom end of the wirings 3. Therefore, the metal oxide layer 81 or the metal nitride layer 82 can prevent a reaction of residual chlorine or residual fluorine with the component contained in the first barrier metal film 3a. Accordingly, the reaction between the wirings 3 and the via plug 7 can be prevented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a substrate;
   a first insulating film disposed above the substrate;
   a wiring disposed in the first insulating film, the wiring extending in a first direction along an upper surface of the substrate, the wiring having a first film and a first metal layer that is disposed on the first film;
   a plug disposed on the wiring, the plug extending in a second direction that intersects the first direction, the plug electrically connected to the wiring;
   a first layer containing a metal oxide or a metal nitride, the first layer disposed between the plug and the wiring; and a second metal layer disposed between the first layer and the first metal layer, the second metal layer having a different composition from the first layer, wherein the first film, the first layer and the second metal layer contain a same first metal element, and the wiring includes a first wiring and a second wiring adjacent to the first wiring, wherein the first film of the first wiring and the first film of the second wiring have a different thickness.

2. The semiconductor device according to claim 1, wherein the first layer is in contact with the plug.

3. The semiconductor device according to claim 1, wherein the first film contains titanium.

4. The semiconductor device according to claim 3, wherein the first layer contains titanium oxide.

5. The semiconductor device according to claim 3, wherein the first layer contains titanium nitride.

6. A semiconductor device comprising:
a first substrate;
a logical circuit disposed on the first substrate;
a first insulating film disposed above the logical circuit;
a wiring including:
    a first film disposed in the first insulating film, the first film extending in a first direction along an upper surface of the first substrate, and
    a first metal layer disposed in the first insulating film and on the first film;
a plug disposed under the wiring, the plug extending in a second direction that intersects the first direction, the plug electrically connected to the wiring;
a first layer, containing a metal oxide or a metal nitride, the first layer disposed between the plug and the wiring; and
a second metal layer disposed between the first layer and the first metal layer, the second metal layer having a different composition from the first layer,
wherein the first film, the first layer and the second metal layer contain a same first metal element, and
the wiring includes a first wiring and a second wiring adjacent to the first wiring, wherein the first film of the first wiring and the first film of the second wiring have a different thickness.

7. The semiconductor device according to claim 6, wherein the first layer is in contact with the plug.

8. The semiconductor device according to claim 6, wherein a bottom end of the first layer is positioned at a bottom end of the first film in the second direction.

9. The semiconductor device according to claim 6, wherein the first layer contains an oxide or a nitride of the first metal element.

10. The semiconductor device according to claim 6, wherein the first metal element is titanium.

11. The semiconductor device according to claim 10, wherein the first layer contains titanium oxide.

12. The semiconductor device according to claim 10, wherein the first layer contains titanium nitride.

13. The semiconductor device according to claim 6, further comprising a second insulating film, wherein the plug is disposed above the logical circuit and in the second insulating film provided under the first insulating film, the plug including a metal nitride film and a third metal layer, the third metal layer disposed in the second insulating film through the metal nitride film.

14. The semiconductor device according to claim 13, wherein the third metal layer contains tungsten, and the metal nitride film contains titanium nitride or tungsten nitride.

15. The semiconductor device according to claim 6, wherein the first metal layer of the wiring contains copper.

16. The semiconductor device according to claim 6, wherein the wiring includes at least one of a pad or a plug.

17. The semiconductor device according to claim 6, wherein the first film includes a diffusion barrier metal.

18. The semiconductor device according to claim 6, wherein the first layer is arranged to prevent a reaction between the plug and the wiring.

19. The semiconductor device according to claim 6, further comprising a diffusion barrier between the first layer and the plug.

20. The semiconductor device according to claim 6, wherein the wiring is a bit line.

21. The semiconductor device according to claim 6, wherein a portion of the plug is positioned on the side of the wiring.

22. A semiconductor device comprising:
a substrate;
an insulating film disposed above the substrate;
a first wiring including:
    a first film disposed in the insulating film, the first film extending in a first direction along an upper surface of the first substrate, the first film containing a first metal, and
    a first metal layer disposed in the insulating film and on the first film;
a plug electrically connected to the first wiring, the plug extending in a second direction that intersects the first direction;
a first layer, containing a metal oxide or a metal nitride, the first layer disposed between the plug and the first wiring;
a second metal layer disposed between the first layer and the first metal layer, the second metal layer containing the first metal and having a different composition from the first layer, wherein the first film, the first layer and the second metal layer contain a same metal element; and
a second wiring disposed adjacent to the first wiring, the second wiring having a second film containing the first metal, the second film extending in the first direction,
wherein the first film and the second film have a different thickness in the second direction.

23. The semiconductor device according to claim 22, wherein the same metal element is titanium.

24. The semiconductor device according to claim 23, wherein the first layer contains titanium oxide.

25. The semiconductor device according to claim 23, wherein the first layer contains titanium nitride.

26. The semiconductor device according to claim 22, wherein the first metal layer of the wiring contains copper.

* * * * *